United States Patent
Poddar et al.

(10) Patent No.: US 7,615,407 B1
(45) Date of Patent: Nov. 10, 2009

(54) METHODS AND SYSTEMS FOR PACKAGING INTEGRATED CIRCUITS WITH INTEGRATED PASSIVE COMPONENTS

(75) Inventors: Anindya Poddar, Sunnyvale, CA (US); Ashok Prabhu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 13 days.

(21) Appl. No.: 12/166,938

(22) Filed: Jul. 2, 2008

(51) Int. Cl.
*H01L 21/00* (2006.01)
(52) U.S. Cl. .................. 438/106; 438/113; 438/381; 438/614; 257/E21.508
(58) Field of Classification Search .......... 438/106, 438/110, 113, 381, 612–615; 257/E21.508, 257/E21.509
See application file for complete search history.

(56) References Cited

U.S. PATENT DOCUMENTS 6,518,161 B1   2/2003   Rajagopalan et al.
7,176,117 B2 *  2/2007  Huang .................. 438/614
7,245,011 B2 *  7/2007  Liu ...................... 257/724
7,439,098 B2 * 10/2008  Yang et al. ............. 438/106
2004/0127011 A1 * 7/2004  Huang et al. ........... 438/613

OTHER PUBLICATIONS

FlipChip International, "Bump on I/O Process," downloaded on Nov. 1, 2007 from http://www.flipchip.com/services/wafer_level/ultra_csp/bump_process.shtml.
FlipChip International, "Redistributed Process," downloaded on Nov. 1, 2007 from http://www.flipchip.com/services/wafer_level_ultra_csp/redistributed_process.shtml.

* cited by examiner

*Primary Examiner*—Tuan N. Quach
(74) *Attorney, Agent, or Firm*—Beyer Law Group LLP

(57) ABSTRACT

A method is described for packaging integrated circuit dice such that each package includes a die with an integrated passive component mounted to the active surface of the die.

20 Claims, 10 Drawing Sheets

METHODS AND SYSTEMS FOR PACKAGING INTEGRATED CIRCUITS WITH INTEGRATED PASSIVE COMPONENTS

TECHNICAL FIELD

The present invention relates generally to the packaging of integrated circuits (ICs). More particularly, methods and systems are described for producing IC packages that include integrated passive components.

BACKGROUND OF THE INVENTION

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections. In general, the die and portions of the leadframe are encapsulated with a molding material to protect the delicate electrical components on the active side of the die while leaving selected portions of the leadframe exposed to facilitate electrical connection to external devices.

The resultant IC packages are often mounted onto printed circuit boards (PCBs). The PCB is used to mechanically support and electrically connect electronic components including the IC package using conductive pathways, or traces, typically etched from copper sheets laminated onto a non-conductive substrate. In many applications, it is desirable to position various non-active (or passive) components along some of the traces to interrupt certain signal transmission paths between the die and an external device or power supply. By way of example, one or more of resistors, capacitors and/or inductors are often mounted onto the PCB. A bypass capacitor, for instance, is often used to decouple one part of the circuit from another. More specifically, a bypass capacitor may be used to bypass the power supply or other high impedance component of the circuit.

Unfortunately, the extended lengths of the signal transmission paths themselves lead to increased parasitic resistances and inductances in the circuit. By way of example, in applications utilizing leadframes with bonding wires, the path length of a given signal is roughly equal to the sum of the lengths of the bonding wire, the length of the lead, the length of the trace coupling the lead to a passive component(s), the length of the passive component(s) and the length of the trace coupling the passive component(s) to an external device. Higher resistance and increased inductance are particularly problematic in high speed applications such as high speed analog to digital converters (ADCs) in which it is desirable to maximize the operating frequency and minimize the time delay.

While existing arrangements and methods for packaging IC devices work well, there are continuing efforts to both miniaturize the size of IC devices and improve the electrical performance of IC devices.

SUMMARY OF THE INVENTION

In one aspect, a method is described for packaging integrated circuit dice such that each package includes a die with an integrated passive component mounted thereon. A wafer is first provided that includes a multiplicity of integrated circuit dice. The active surface of each die includes a first set of bond pads and a second set of bond pads. A first conductive layer is deposited over the active surfaces of the dice. Subsequently, a second conductive barrier layer is then deposited over the first conductive layer. A third solder-wettable conductive layer is then deposited over the second conductive barrier layer. Portions of the first conductive layer, second conductive barrier layer and third solder-wettable conductive layer that do not overlie the first set of bond pads or the second set of bond pads of each die are then removed. Subsequently, portions of the second conductive barrier layer and the third solder-wettable conductive layer that overlie the second set of bond pads of each die are removed. A layer of solder is then deposited over portions of the third solder-wettable conductive layer that overlie the first set of bond pads of each die. A non-active or passive electrical component is then positioned over the active surface of each die such that electrodes from the non-active electrical component are positioned adjacent solder deposited over ones of the first set of bond pads of the die. The solder is then reflowed to electrically and physically connect the electrodes of the non-active electrical component with the ones of the first set of bond pads. The wafer may then be singulated to provide individual integrated circuit dice each having an integrated passive component mounted on the surface of the die.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF EXAMPLE EMBODIMENTS

The present invention relates generally to the packaging of integrated circuits (ICs). More particularly, methods and systems are described for producing IC packages that include integrated passive components.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

The following description focuses on the production of an IC package that includes a die having both a first set of solder-wettable bond pads as well as a second set of bond pads arranged for electrical connection with bonding wires. The first set of solder-wettable bond pads are arranged for direct connection with electrodes (or leads) from a non-active (passive) electrical component (or components) via solder joints while the second set of bond pads are connected via bonding wires with leads or other contacts from a suitable substrate such as a leadframe that facilitates connection with an external device. Various embodiments of the present invention will be described with reference to FIGS. 1-9.

Figure 1:
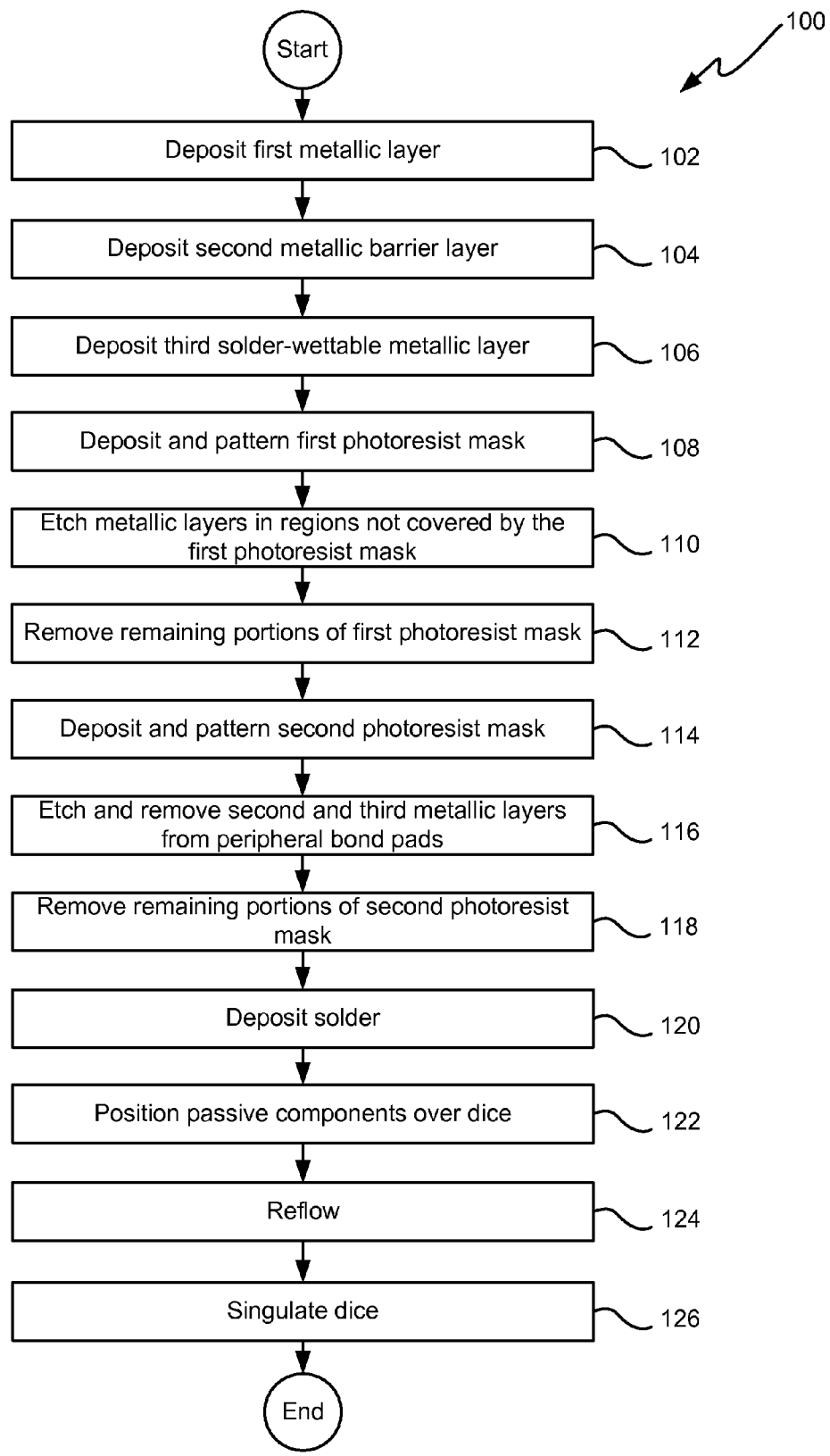
FIG. 1 is a flow chart illustrating a process for preparing IC dice for packaging in accordance with an embodiment of the present invention.
Figure 2:
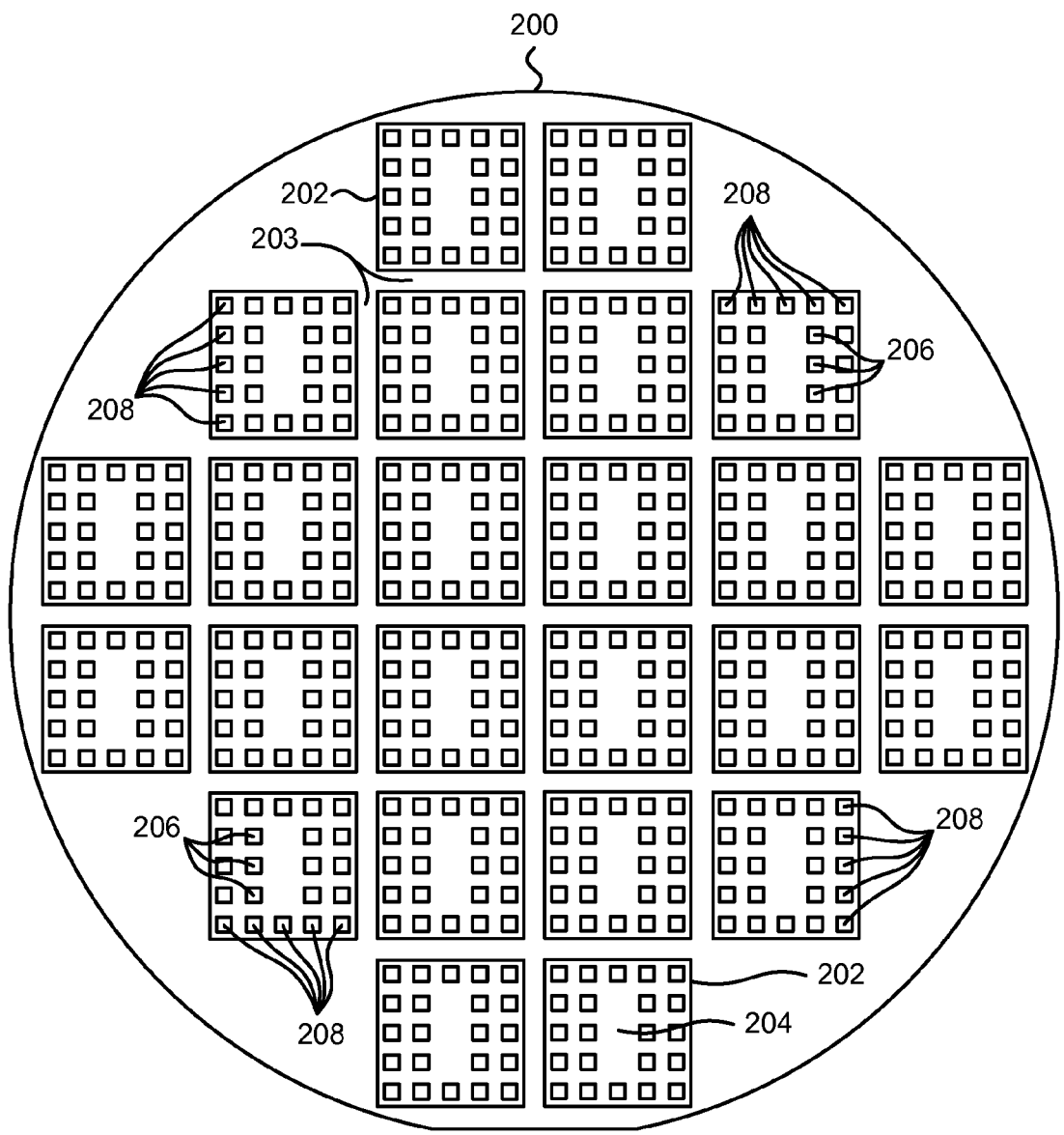
FIG. 2 illustrates a diagrammatic top view of an example wafer suitable for use in accordance with an embodiment of the present invention.

Referring initially to FIG. 1, and further in view of FIGS. 2-3, a process 100 for preparing IC dice for packaging in accordance with particular embodiments of the present invention will be described. Initially, a semiconductor wafer 200 that includes a large number of dice is fabricated. As is well known in the art, most wafers and dice are formed of silicon (Si), although any other appropriate semiconductor material can also be used. FIG. 2 illustrates a diagrammatic top view of a suitable wafer 200. While the wafer 200 diagrammatically illustrated in FIG. 2 shows only a few IC dice 202, it will be appreciated by those familiar with the art that state of the art wafers will typically have several hundred to several thousand dice formed therein and it is expected that even higher device densities will be attained in future wafers. The dice 202 are generally formed into a two-dimensional array of rows and columns with each row/column being separated from immediately adjacent rows/columns by scribe lines 203 (also known as saw streets). Each die 202 will become an IC component after it is singulated from the wafer 200.

An IC die 202 generally has multiple metallization layers that overlie active circuits formed within the semiconductor substrate of the die. Intermediate dielectric layers are typically interposed between the metallization layers to physically and electrically separate the metallization layers. Electrically conductive vias are formed in the dielectric layers at appropriate locations in order to electrically connect specific portions of the metallization layers in desired locations. The various metallization layers may be used as ground/power planes and/or as signal routing interconnects within the IC die. A variety of materials may be used to form the dielectric and metallization layers. By way of example, aluminum (Al) and copper (Cu) are often used materials for the metallization layers and (in Si based devices) silicon dioxide, silicon nitride and/or other oxides and nitrides are commonly used to form the dielectric layers. Selected portions of the topmost metallization layer are left exposed through various openings in the outermost dielectric or passivation layer on the active surface 204 of each die 202 to form a plurality of bond pads (hereinafter also referred to as "I/O pads") 206 and 208 that serve as electrical contacts for the die (collectively the active surfaces 204 of the dice 202 form the active surface of the wafer). In the illustrated embodiment, each die 202 includes 6 inner bond pads 206 and 16 peripheral bond pads 208; however, the number, size and layout of the bond pads 206 and 208 may vary widely according to the needs of a particular application. Additionally, although the exposed portions of the inner bond pads 206 and peripheral bond pads 208 are illustrated as having square geometries, it will be appreciated by those of skill in the art that the bond pads may assume other geometries as well, such as for example rectangles or circles.

As will be appreciated by those familiar with the art, the I/O pads used with solder-bumped and wire-bonded dice may be the original bond pads on the original active surface of the die, but may also be bond pads that have been redistributed from the original bond pads using conventional redistribution techniques. More particularly, the original bond pads are often distributed around the perimeter of the die at a prescribed distance from the peripheral edges of the die. This bond pad configuration is generally suitable for most wire-bonded applications; however, it may be advantageous to redistribute some or all of the original bond pads using metal redistribution lines to form a desired final array layout of I/O bond pads 206 and 208.

Figure 3A:
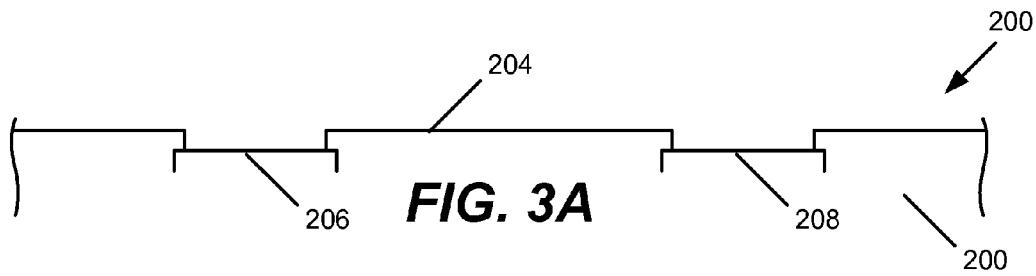
FIGS. 3A-H illustrate diagrammatic cross-sectional side views of a portion of the wafer of FIG. 2 at various steps in the process of FIG. 1.
Figure 3B:
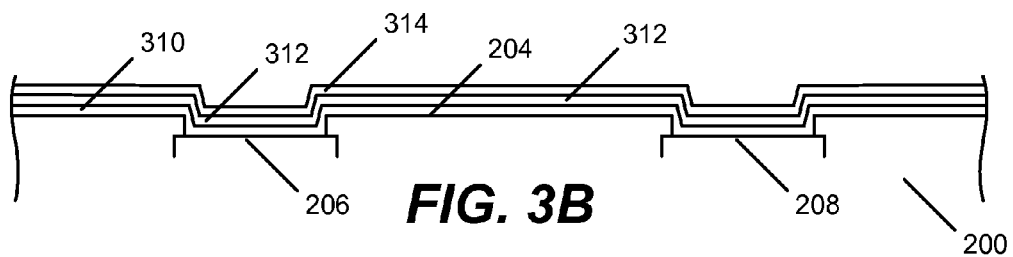

At 102, a first metallic layer 310 is deposited onto the active surface of the wafer 200. FIGS. 3A and 3B illustrate diagrammatic cross-sectional side views of a portion of a die 202 before and after the deposition of the metallic layer 310, respectively. The metallic layer 310 preferably covers the entire active surface of the wafer 200, or at least the portions of the wafer that form the active surfaces of the dice 202. The thickness of the metallic layer 310 is preferably on the order of approximately 1 µm, although both thinner and thicker metallic layers may be suitable and are permitted. In one particular embodiment, the thickness of the metallic layer 310 is approximately 1.0 µm. Although any suitable process may be used to deposit the metallic layer 310, such as for example sputtering or evaporation, in one preferred embodiment the metallic layer is sputtered onto the active surface of the wafer 200. In the illustrated embodiment, the inner bond pads 206 and peripheral bond pads 208 are formed from aluminum and the metallic layer 310 is formed from aluminum or a suitable aluminum alloy. By way of example, the aluminum alloy may be an alloy of approximately 99.5% aluminum and 0.5% copper, although other aluminum and copper alloys as well as other materials may be suitable as well.

Following application of the metallic layer 310, a second metallic layer 312 is deposited at 104 over the first metallic layer 310. Again, in one preferred embodiment, the metallic layer 312 is sputtered onto the metallic layer 310. In the illustrated embodiment, the metallic layer 312 entirely covers the metallic layer 310. The metallic layer 312 serves as a diffusion barrier layer having material properties and a thickness that are suitable to prevent the diffusion or migration of metallic ions through the metallic layer 312. By way of example, it one embodiment the thickness of the metallic layer 312 is approximately 0.8 µm although, again, thinner and thicker metallic layers may be suitable and are permitted. One suitable material for use as the metallic barrier layer 312 is, by way of example, an alloy of nickel and vanadium (NiV). The purpose of the metallic layer 312 will become more apparent from the following discussion.

At 106, a third solder-wettable metallic layer 314 is deposited over the second barrier layer 312. The solder-wettable layer 314 is preferably sputtered onto the barrier layer 312 such that it entirely covers the barrier layer 312. A solder-wettable layer thickness of approximately 0.3 µm has been shown to work well. The solder-wettable layer 314 is preferably formed of a material that is wettable to a variety of solder materials (e.g., tin and lead). By way of example, in the illustrated embodiment, the solder-wettable layer 314 is formed from copper.

In general, suitable thicknesses for all of the aforementioned metallic layers 310, 312 and 314 will depend upon the materials used to form the respective layers.

Figure 3C:
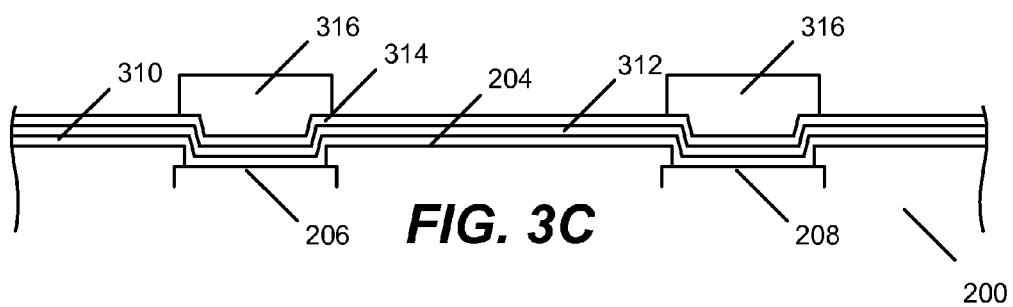
Figure 3D:
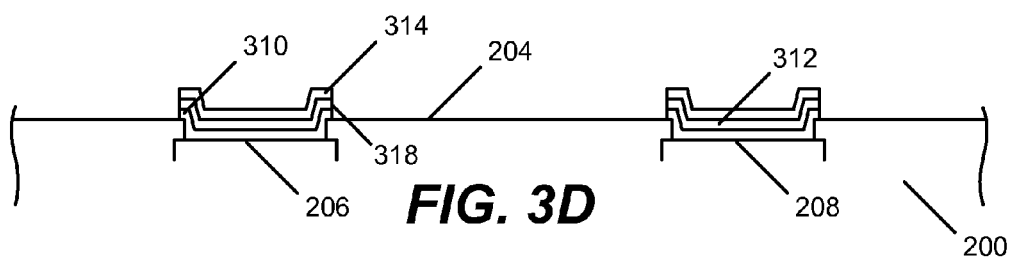

In one embodiment, a photoresist mask 316 is deposited over the active surface of the wafer 200 at 108. In the illustrated embodiment, the photoresist mask 316 is patterned such that only the bond pads 206 and 208 are covered by the mask, as illustrated in FIG. 3C. The metallic layers 310, 312 and 314 are then etched at 110 in regions not covered by the mask 316 as illustrated in FIG. 3D. The remaining portions of the mask 316 (i.e., the portions covering the bond pads 206 and 208) are then removed at 112. In this way, only the bond pads 206 and 208 remain covered by the metallic layers 310, 312 and 314. Here it should be noted that the stack of metallic layers 310, 312 and 314 formed over each inner bond pad 206 serve as an underbump metallurgy stack (UBM) 318 suitable to receive solder and to facilitate the formation of a solder joint connection with an associated contact. As such, the UBMs 318 are preferably patterned so as to be circular as viewed from above the active surfaces 204 of the dice 202.

Figure 3E:
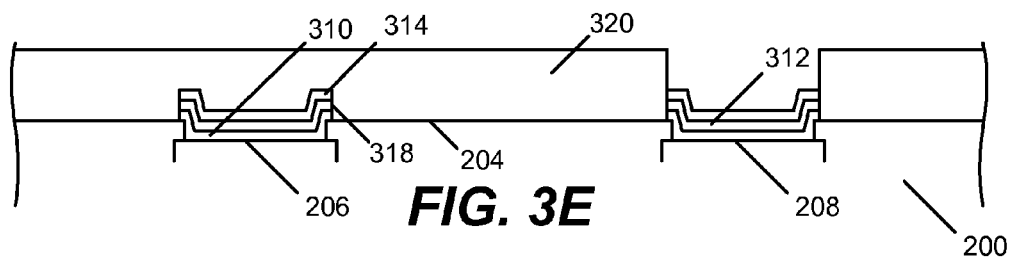
Figure 3F:
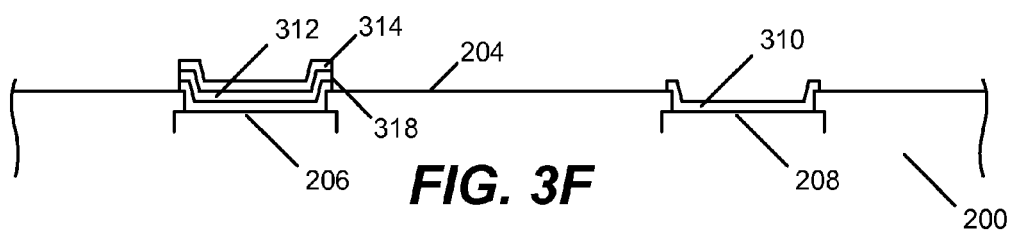

At 114 a second photoresist mask 320 is deposited and patterned over the active surface of the wafer such that only the peripheral bond pads 208 are uncovered by the mask 320 as illustrated in FIG. 3E. The portions of the metallic layers 312 and 314 over the peripheral bond pads 208 are then etched and removed at 116. In the embodiment illustrated in FIG. 3F, a small amount of the first metallic layer 310 may also be removed to ensure that the metallic layers 312 and 314 are entirely removed from the bond pads 208. By way of example, in one embodiment, approximately 0.2 μm of the metallic layer 310 covering each bond pad 208 is etched and removed. Subsequently, the remaining portions of the mask 320 are removed at 118 from the active surface of the wafer.

Figure 3G:
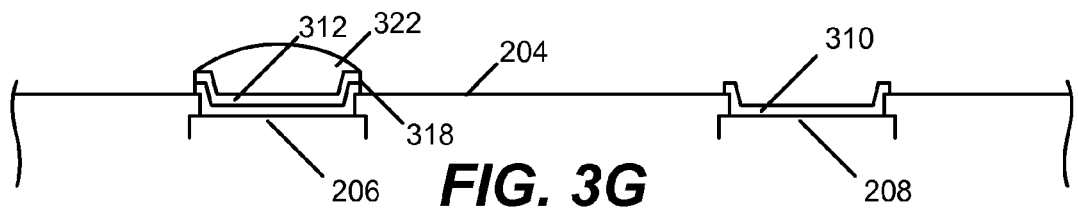
Figure 3H:
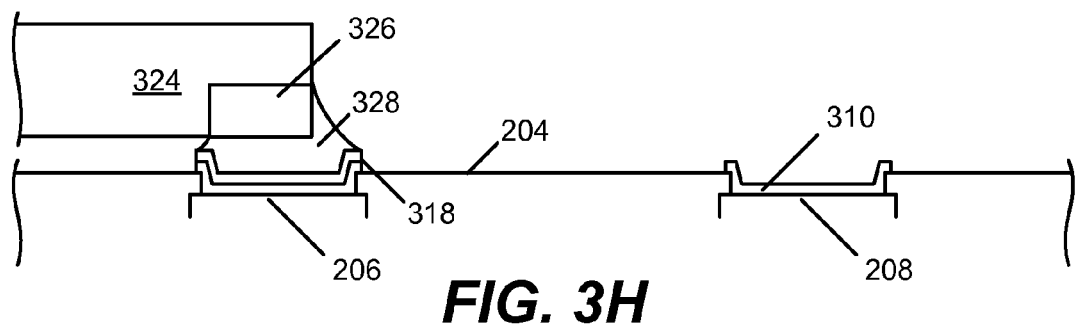
Figure 4:
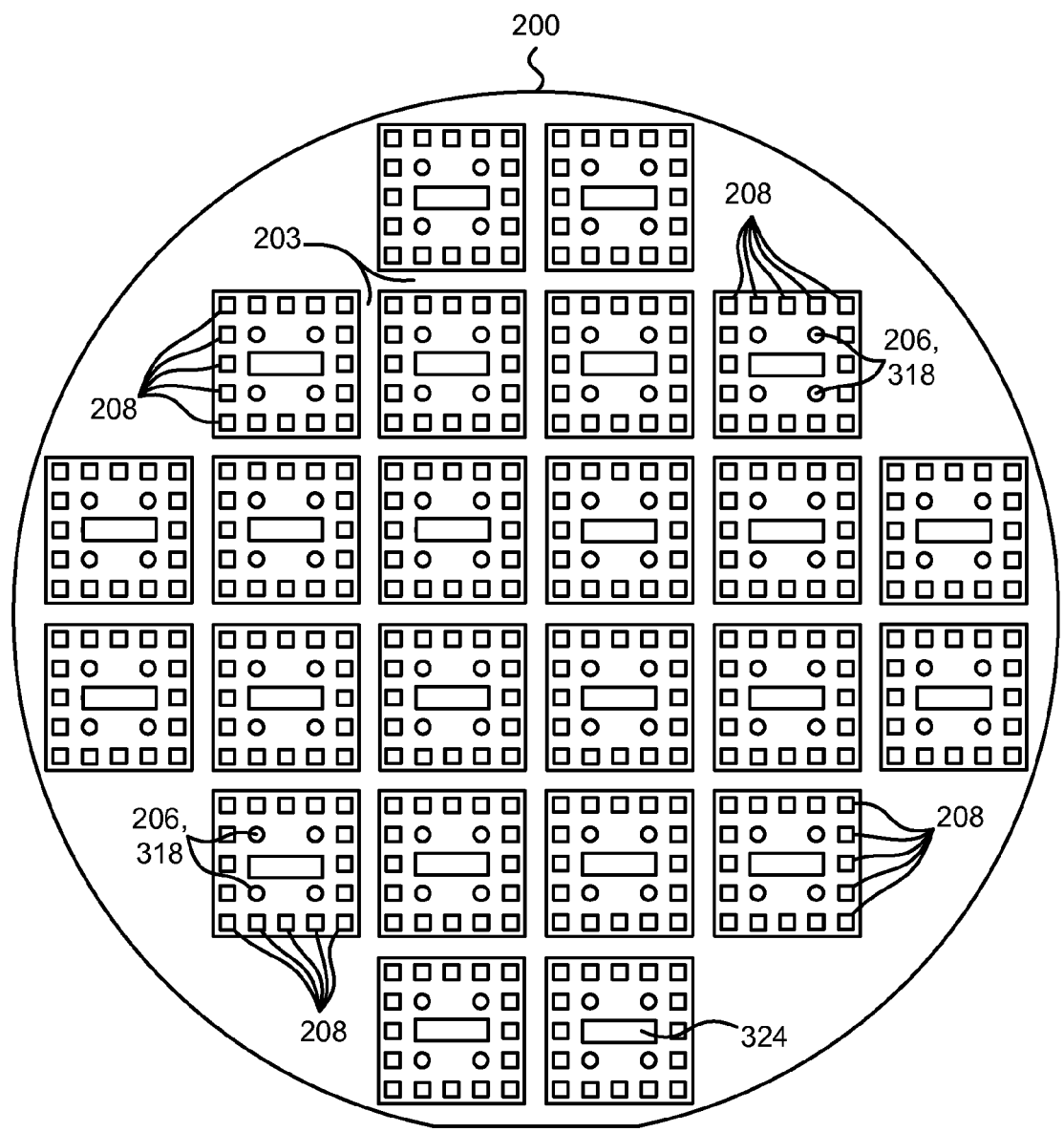
FIG. 4 illustrates a diagrammatic top view of the wafer of FIG. 2 after the attachment of passive components in accordance with an embodiment of the present invention.

As illustrated in FIG. 4, the resulting wafer 200 includes dice 202 each having a number of inner bond pads 206 that are covered by solder-wettable UBMs 318 as well as a number of peripheral bond pads 208 each having surfaces suitable for wire bonding. Solder bumps 322 are deposited at 120 over the UBM stacks 318 as illustrated in FIG. 3G. The solder bumps 322 may be deposited with any suitable means and are generally formed of a mixture of tin (Sn) and lead (Pb). By way of example, the solder bumps may be applied in the form of a solder paste using a needle dispenser. Solder pastes generally include a mixture of solder as well as flux, which further facilitates the spread of solder across the bonding surfaces of the UBMs 318.

According to various embodiments, one or more surface-mountable passive electrical components 324 are then positioned over the active surfaces 204 of each die 202. By passive it is meant that the components are not active; that is, the passive components are incapable of power gain. Suitable passive components 324 may include, by way of example: capacitors, resistors, inductors and crystals (such as quartz for timing purposes) among others. By positioning the passive components 324 directly onto the surface of each die 202, the signal transmission path between the die and an associated external device after mounting to a PCB can be significantly reduced. As described earlier, it is generally desirable to minimize the lengths of the signal transmission paths to and from the die and external devices and other contacts. Conventionally, passive components are positioned outside the IC package on the PCB. However, according to the embodiments of the present invention, various passive components are positioned directly onto the surface of the die 202 (prior to packaging the die) effectively eliminating virtually the entire transmission path length from the die to the passive components 324. During operation, various signals may be routed through the passive component(s) on the surface of the die 202 prior to transmission out of the IC package via the peripheral bond pads 208 or, conversely, signals coming into the die via the peripheral bond pads may be routed through the passive components prior to being routed to the active circuits within the die.

In the illustrated embodiment, a single passive component 324 is positioned over the active surface 204 of each die at 122. More particularly, lead contacts 326 are positioned over corresponding inner bond pads 206. The solder bumps 322 are reflowed at 124 to form solder joints 328 that physically and electrically connect the passive components 324 to their respective dice 202. In one embodiment, during reflow, the solder-wettable metallic layer 314 diffuses into the solder joint. This is a result of the affinity of the copper in the metallic layer 314 for the tin in the solder. The metallic barrier layer 314 remains adhered to the solder and prevents further diffusion as well as detachment of the solder joints 328 from their respective bond pads 206.

Although only a single passive component 324 is positioned onto the active surface of each die 202 in the illustrated embodiment, it should be noted that in other embodiments, two or more passive components may be positioned onto the active surface of each die. Furthermore, the passive components positioned onto each die may assume a wide variety of shapes and sizes. As such, the layout and geometry of the bond pads 206 may be widely varied based on the requirements of a particular application.

The wafer 200 may then be singulated at 126 to yield individual dice 202. The wafer 200 may be singulated with any suitable means. By way of example, the wafer 200 may be singulated using sawing, gang-cutting (sawing), laser cutting or plasma cutting along the scribe lines 203.

Figure 5:
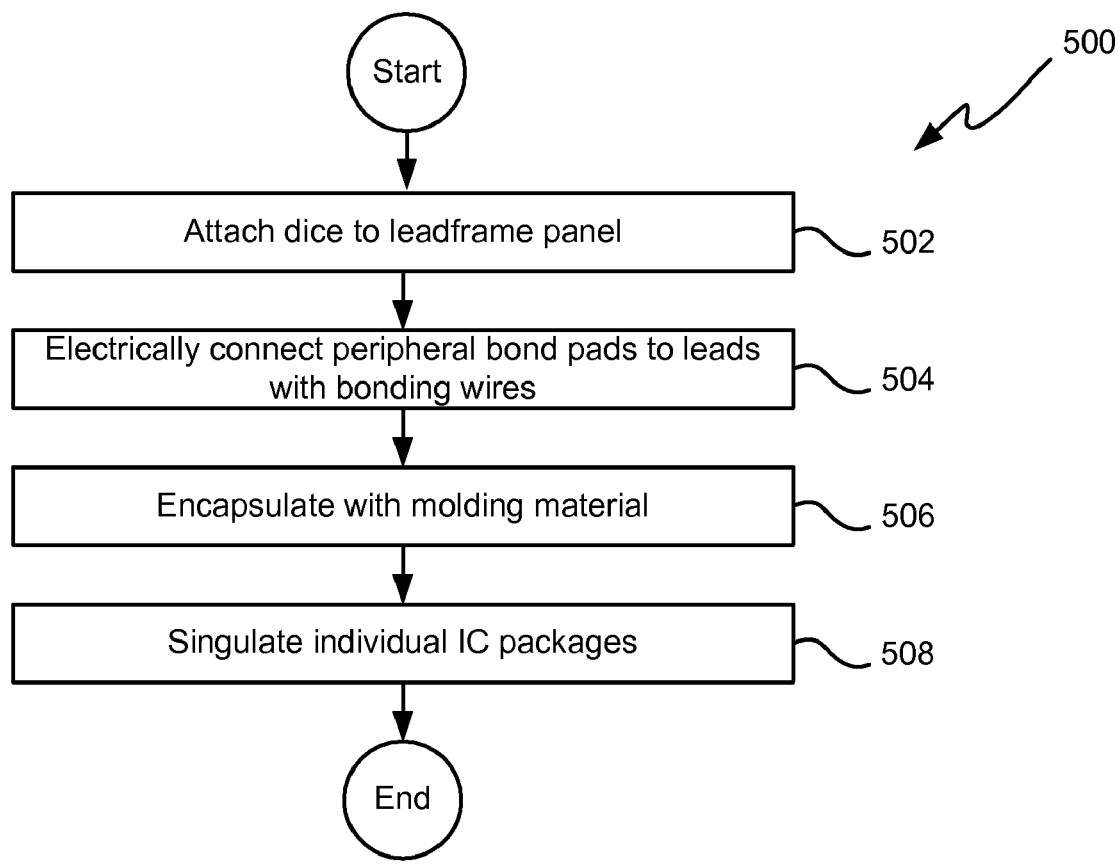
FIG. 5 is a flow chart illustrating a process for packaging IC dice in accordance with an embodiment of the present invention.

A process 500 for packaging the dice 202 will now be described with reference to FIGS. 5-7. Each singulated die 202 may be positioned and attached within a die attach area of a suitable substrate. By way of example, in the illustrated embodiment, each die 202 is positioned onto a leadframe panel at 502.

Figure 6A:
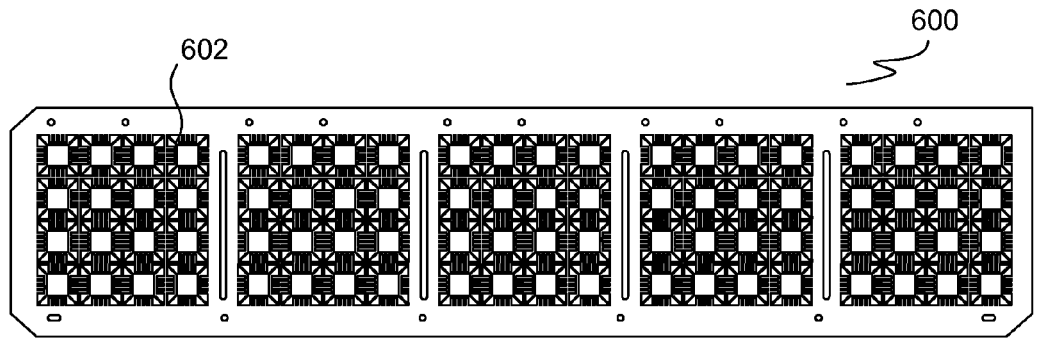
FIGS. 6A-C illustrate diagrammatic top views of a leadframe panel suitable for use in packaging IC dice in accordance with an embodiment of the present invention.
Figure 6B:
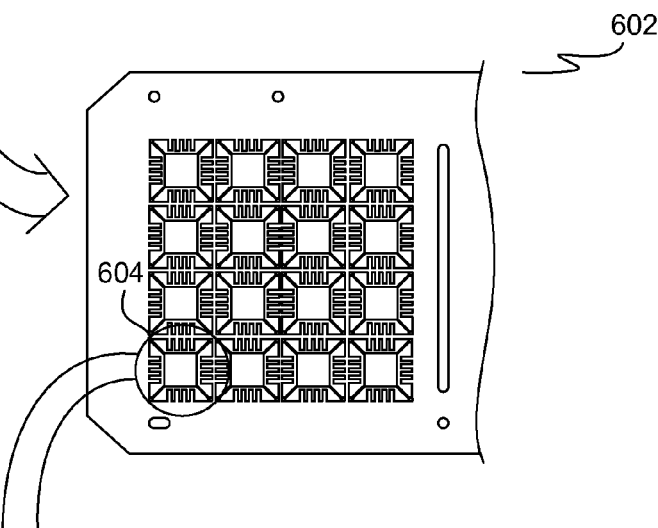
Figure 6C:
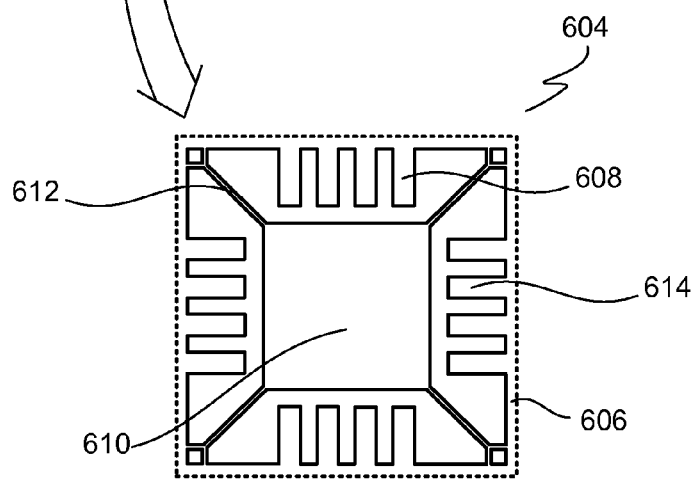

With respect to FIGS. 6A-C, an exemplary leadframe panel 600 suitable for use in packaging integrated circuits according to various embodiments of the present invention will be described. FIG. 6A illustrates a diagrammatic top view of a leadframe panel 600 arranged in the form of a strip. The leadframe panel 600 can be configured as a metallic structure having a number of two-dimensional arrays 602 of device areas. By way of example, leadframe panel 600 may be formed from copper or a suitable copper alloy. As illustrated in the successively more detailed FIGS. 6B-C, each two-dimensional array 602 includes a plurality of device areas 604, each configured for use in a single IC package, and each connected by fine tie bars 606.

Each device area 604 includes a number of leads 608, each supported at one end by the tie bars 606. In the illustrated embodiment, each device area 604 includes sixteen leads 608, four of which extend from each of four sides of a die attach pad 610 (those familiar with the art will recognize this configuration as a typical leadless leadframe package (LLP) configuration). The die attach pad 610 is partly supported by die attach pad support bars 612 that extend from the corners of the die attach pad to tie bars 606. Each lead 608 includes a conductive wire bonding surface 614 on the top surface of the leadframe and a package contact surface 616 on the bottom (back) surface of the leadframe. The leads 608 may be etched, half-etched, or otherwise thinned relative to the package contact surfaces, so as to provide electrical connection to contacts on a PCB while limiting the exposed conductive areas on the bottom surface of the leadframe as well as providing a mold locking feature. In some embodiments, it may also be desirable to etch or otherwise thin the top surface of the leadframe as well. Additionally, an adhesive tape may be attached to the bottom surface of the leadframe panel 600. The tape may serve to provide structural support for the leadframe features and additionally aid during encapsulation of the leadframe panel 600 with molding material.

It will be appreciated by those skilled in the art that, although a specific leadframe panel 600 has been described and illustrated, the described methods may be applied in packaging dice 202 utilizing an extremely wide variety of other leadframe panel or strip configurations as well as other substrates, such as substrates used in ball-grid array (BGA) package configurations. Additionally, although described with references to top and bottom surfaces of the leadframe panel 600, it should be appreciated that this context is intended solely for use in describing the structure and in no way defines or limits the orientation of the leadframe relative to other package components.

Figure 7A:
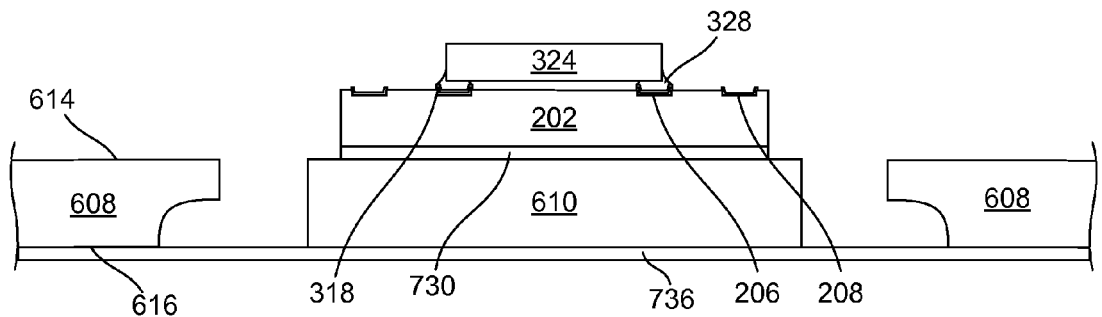
FIGS. 7A-C illustrate diagrammatic cross-sectional side views of an IC die at various steps in the process of FIG. 5.
Figure 7B:
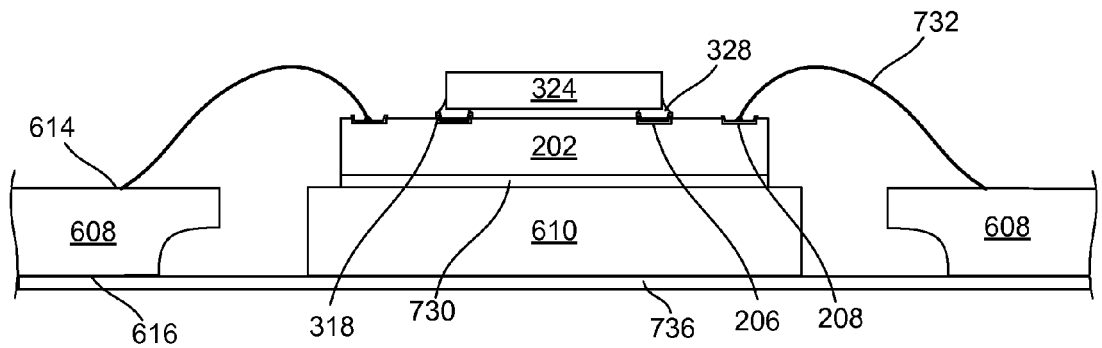
Figure 7C:
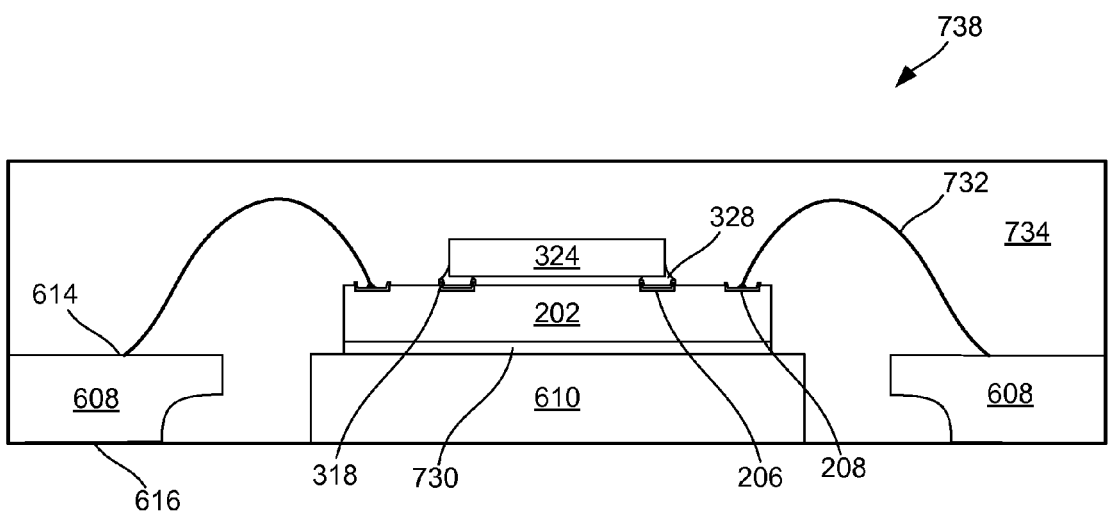

FIGS. 7A-C illustrate diagrammatic cross-sections of one device area 604 of the leadframe panel 600 at various steps during process 500. In the embodiment illustrated in FIG. 7A, the die 202 is physically attached to the die attach pad 610 by means of a suitable die attach material 730 such as, by way of example, an epoxy or adhesive film. In embodiments in which die attach pads are not used, each die 202 is positioned directly onto an adhesive tape 736.

After attaching the dice 202 to the leadframe panel 600, the peripheral bond pads 208 on the active surface of the dice are electrically connected at 504 to the leads 608 by means of metallic (e.g., gold) bonding wires 732. It should be noted that, while aspects of the present invention are particularly well-suited for use in packaging dice that utilize bonding wires, any suitable electrical connections may be used.

At 506 the bonding wires 732, dice 202, passive components 324 and portions of the leadframe panel 600 are encapsulated with a molding material (compound) 734. The molding compound is generally a non-conductive plastic or resin having a low coefficient of thermal expansion. In a preferred embodiment, the entire populated leadframe panel 600 is placed in the mold and encapsulated substantially simultaneously. In another embodiment, the mold may be configured such that each two-dimensional array 602 is encapsulated as a single unit. However, it should be appreciated that a lesser number of dice 202 may also be encapsulated at any one time. It should additionally be appreciated that virtually any molding system may be used to encapsulate the attached dice 202 and leadframe panel 600. By way of example, a film assisted molding (FAM) system may be used to encapsulate the attached dice 202 and passive components 324. The adhesive film prevents molding compound intrusion over the back surfaces of the die attach pads 610 and the package contact surfaces 616 on the bottom surfaces of the leads 608.

Subsequently, the molding compound 734 may be cured in a heated oven (e.g., if the molding compound is a thermosetting plastic) and the adhesive tape 736 may be removed. After curing the molding compound 734, the package contact surfaces 616 may be solder plated to facilitate connection with corresponding contact surfaces on a PCB or other substrate. In some embodiments, the back surfaces of the die attach pads 610 are also solder plated to facilitate external connection to PCBs.

The encapsulated leadframe panel 600 may then be singulated at 508 to yield a multiplicity of individual IC packages 738, such as that illustrated in FIG. 7C. Again, the encapsulated leadframe panel 600 may be singulated with any suitable means. By way of example, the leadframe panel 600 may be singulated using sawing, gang-cutting (sawing), laser cutting or plasma cutting along the tie bars 606 to produce individual IC packages 738. Upon package singulation, the IC packages 738 may be inspected and/or tested before being attached to PCBs or other substrates. Those of skill in the art will recognize that the described method may be used to produce a leadless leadframe package (LLP) or quad-flat-pack-no-lead (QFN) package. However, many other package types, such as for example dual inline packages (DIPs) may be produced as well.

Figure 8A:
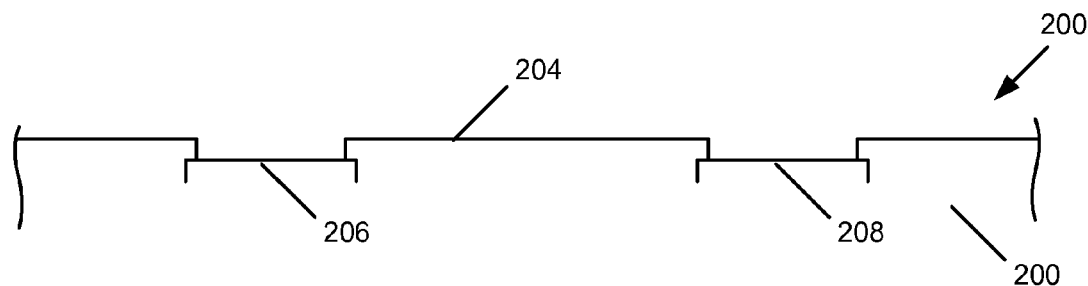
FIGS. 8A-C illustrate diagrammatic cross-sectional side views of a portion of the wafer of FIG. 2 in accordance with an alternate embodiment of the present invention.
Figure 8B:
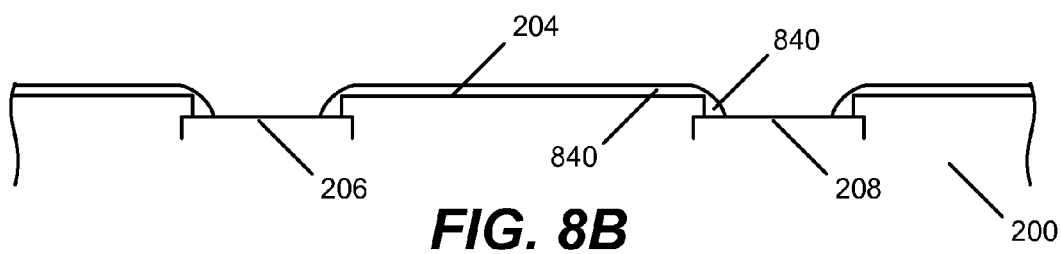
Figure 8C:
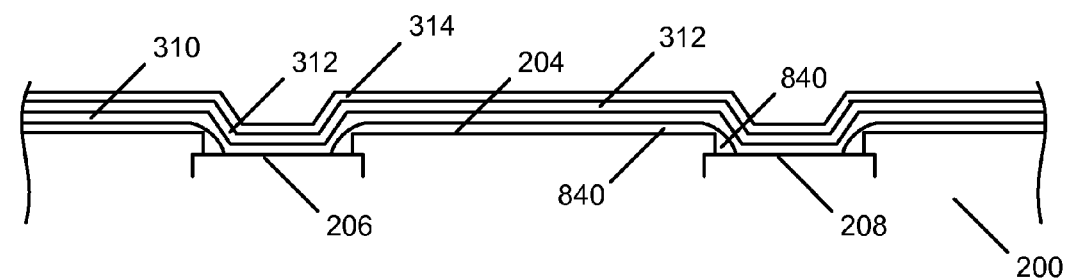

FIGS. 8A-C illustrate steps in an alternate embodiment in which the metallic layers 310, 312 and 314 are deposited over an additional passivation layer 840. FIG. 8A illustrates the same cross-section of the wafer 200 illustrated in FIG. 3A. In the alternate embodiment, the additional passivation layer 840 is deposited over the active surface of the wafer 200 prior to the deposition of the metallic layers 310, 312 and 314 as illustrated in FIG. 8B. By way of example, a passivation layer 840 formed of benzocyclobutene (BCB) may be spun-on or otherwise deposited and patterned over the active surface of the wafer in regions surrounding the bond pads 206 and 208. In the embodiment illustrated in FIG. 8B, the BCB layer 840 is deposited such that it overlies and covers the peripheral edges of each of the bond pads 206 and 208. The metallic layers 310, 312 and 314 are then deposited as before over the BCB layer 840 as illustrated in FIG. 8C. The process may then continue as outlined in process 100.

Figure 9A:
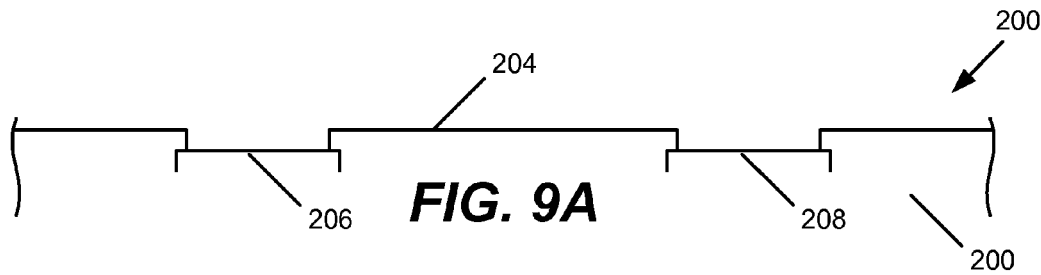
FIGS. 9A-F illustrate diagrammatic cross-sectional side views of a portion of the wafer of FIG. 2 in accordance with an alternate embodiment of the present invention.
Figure 9B:
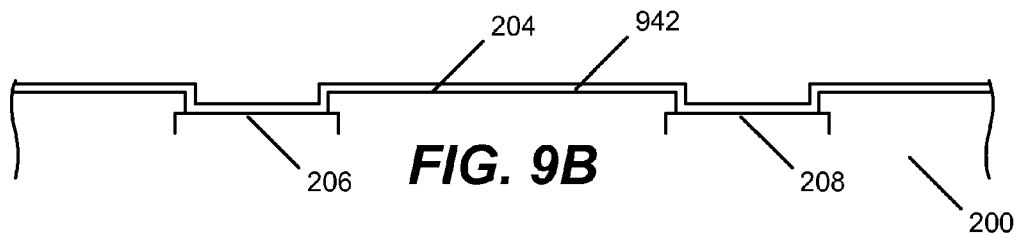
Figure 9C:
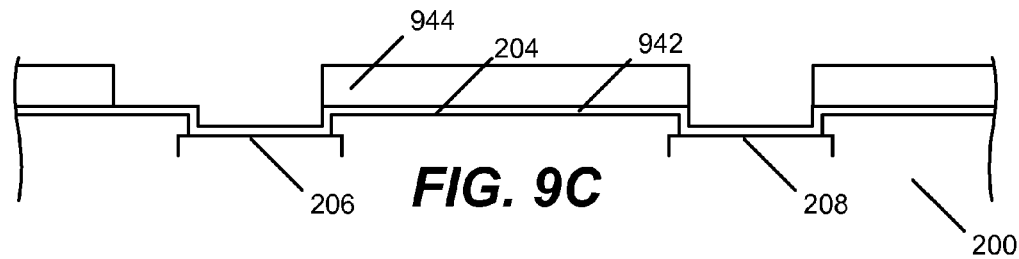
Figure 9D:
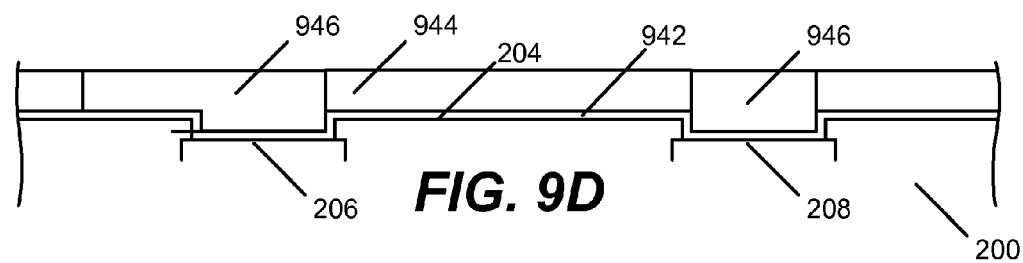

FIGS. 9A-F illustrate steps in still another embodiment. The process begins as before with a suitable wafer 200 as illustrated in FIG. 9A. In this alternate embodiment, however, a conductive seed layer 942 is first deposited over the entire active surface of the wafer 200 as illustrated in the cross-section of FIG. 9B. The seed layer 942 is utilized for a subsequent electroplating step. Any suitable materials can be used to form the seed layer 942. By way of example, in one embodiment, the seed layer 942 is formed from a titanium-copper-titanium layer stack. A mask 944 is then deposited and patterned over the active surface of the wafer is regions surrounding the bond pads 206 and 208, as illustrated in FIG. 9C. Subsequently, as illustrated in FIG. 9D, the active surface of the wafer is electroplated to deposit a conductive layer 946 of copper or other suitable metal over the bond pads 206 and 208. The thickness of the layer 946 may vary according to the particular application, but a thickness in the range of approximately 5-15 µm has been shown to work well. It should be noted that, in some applications, the copper layer 946 may be advantageously patterned so as to redistribute some or all of the bond pads 206 and 208. In embodiments in which some or all of the bond pads 206 or 208 are to be redistributed, the mask is patterned such that the copper layer 946 forms a conductive trace from the bond pads 206 and/or 208 to desired redistributed locations. By way of example, in the embodiment illustrated in FIG. 9D, the mask 944 is patterned so as to allow the deposition of a copper trace segment 948 extending from an inner bond pad 206 to a redistributed bond pad location 950.

Figure 9E:
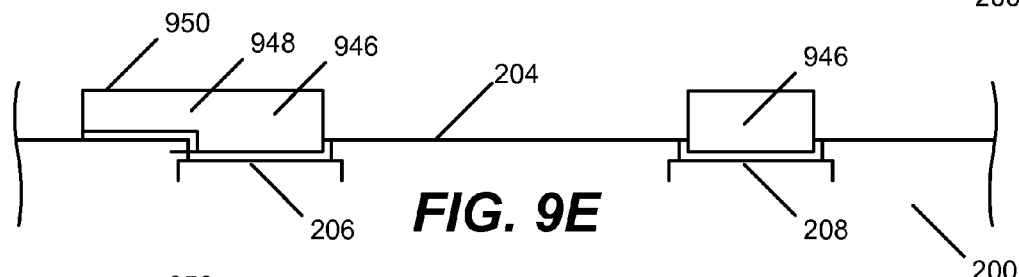
Figure 9F:
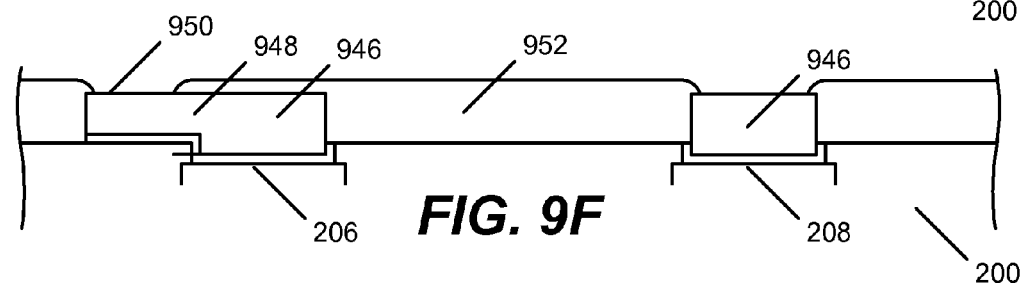

The mask 944 and portions of the seed layer 942 not overlying the bond pads 206 and 208 or the traces 948 and redistributed bond pad locations 950 are then removed as illustrated in FIG. 9E. In the illustrated embodiment, a BCB passivation layer 952 is then deposited in regions surrounding the copper layers 946. In the embodiment illustrated in FIG. 9F, the BCB layer 952 extends over peripheral portions of the bond pad 950 and also covers the associated trace 948 and bond pad 206.

After deposition of the passivation layer 952, the exposed surfaces of the bond pads 206 (or bond pads 950 if redistributed) may then be solder plated. The thickness of the copper layers 946 is sufficient such that only a small proportion of the copper is absorbed into the solder thereby preventing detachment of the resultant solder joints from the bond pads 206 or 950. In other embodiments, the process may continue as outlined in process 100 of FIG. 1. More specifically, in these other embodiments the metallic layers 310, 312 and 314 may be deposited over the copper layers 946 and passivation layer 952 rather than directly over the bond pads 206 and 208 as was the case in the embodiment illustrated in FIGS. 3A-H.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings. By way of example, the passive components may be mounted onto the active surfaces of the dice after the wafer has been singulated. Additionally, the metallic layers 310, 312 and 314 may, themselves, be used to redistribute some or all of the bond pads 206 and 208.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of packaging integrated circuit devices, comprising:
    providing an integrated circuit wafer, the wafer including a multiplicity of integrated circuit dice, each die having an active surface and a back surface, the active surface of each die including a first set of bond pads and a second set of bond pads, the back surfaces of the dice combining to form the back surface of the wafer;
    depositing a first conductive layer over the active surfaces of the dice;
    depositing a second conductive barrier layer over the first conductive layer;
    depositing a third solder-wettable conductive layer over the second conductive barrier layer;
    removing portions of the first conductive layer, second conductive barrier layer and third solder-wettable conductive layer that do not overlie the first set of bond pads or the second set of bond pads of each die;
    removing portions of the second conductive barrier layer and the third solder-wettable conductive layer that overlie the second set of bond pads of each die;
    depositing a layer of solder over portions of the third solder-wettable conductive layer that overlie the first set of bond pads of each die;
    positioning a non-active electrical component over the active surface of each die such that electrodes from the non-active electrical component are positioned adjacent solder deposited over ones of the first set of bond pads of the die;
    reflowing the solder to electrically and physically connect the electrodes of the non-active electrical component with the ones of the first set of bond pads.

2. A method as recited in claim 1, further comprising singulating the wafer to provide a multiplicity of individual integrated circuit dice each having a non-active component physically and electrically connected to an active surface thereof.

3. A method as recited in claim 2, further comprising electrically connecting ones of the second set of bond pads to associated leads of an associated leadframe with bonding wires.

4. A method as recited in claim 1, wherein the non-active electrical component is a passive component selected from the group consisting of: a capacitor, a resistor, and an inductor.

5. A method as recited in claim 1, wherein the non-active electrical component is a crystal used for timing purposes.

6. A method as recited in claim 1, wherein each step of removing comprises depositing a mask over portions of the active surfaces of the dice and etching portions of the metallic layers not covered by the mask.

7. A method as recited in claim 1, wherein the first conductive layer comprises aluminum or an aluminum alloy.

8. A method as recited in claim 1, wherein the second conductive barrier layer comprises an alloy of nickel and vanadium.

9. A method as recited in claim 1, wherein the third layer comprises copper or a copper alloy.

10. A method as recited in claim 1, wherein the first set of bond pads and the second set of bond pads are formed from aluminum or an aluminum alloy.

11. A method as recited in claim 1, wherein each of the bond pads is horizontally separated from all of the other bond pads by a passivation layer.

12. A method as recited in claim 1, further comprising forming a passivation layer over peripheral edges of the first set of bond pads and peripheral edges of the second set of bond pads prior to depositing the first conductive barrier layer.

13. A method as recited in claim 12, wherein the passivation layer is formed of benzocyclobutene (BCB).

14. A method as recited in claim 1, further comprising positioning a second non-active component over the active surface of each die and physically and electrically connecting electrodes from the second non-active component with other ones of the first set of bond pads.

15. A method as recited in claim 1, wherein the first conductive layer, second conductive barrier layer and third solder-wettable conductive layer form an underbump metallization stack over each bond pad from the first set of bond pads.

16. A method as recited in claim 1, further comprising redistributing ones of the first set of bond pads and/or second set of bond pads with portions of the first conductive layer, second conductive barrier layer and third solder-wettable conductive layer.

17. A method of packaging integrated circuit devices, comprising:
    providing an integrated circuit wafer, the wafer including a multiplicity of integrated circuit dice, each die having an active surface and a back surface, the active surface of each die including a first set of bond pads and a second set of bond pads, the back surfaces of the dice combining to form the back surface of the wafer;
    depositing a first conductive seed layer over the active surfaces of the dice;
    depositing and patterning a mask over the first conductive seed layer such that the first set of bond pads and the second set of bond pads are not covered by the mask;
    depositing a second conductive layer over portions of the first conductive seed layer not covered by the mask;
    removing the mask;
    depositing a passivation layer over at least the portions of the active surfaces of the dice not covered by the second conductive layer;

depositing a layer of solder over portions of the second conductive layer that are electrically connected with the first set of bond pads of each die;

positioning a non-active electrical component over the active surface of each die such that electrodes from the non-active electrical component are positioned adjacent the solder;

reflowing the solder to electrically and physically connect the electrodes of the non-active electrical component with the ones of the first set of bond pads.

18. A method as recited in claim 17, wherein the second conductive layer is formed of copper and wherein the second conductive layer is deposited with an electroplating process.

19. A method as recited in claim 17, wherein the passivation layer is formed from benzocyclobutene (BCB).

20. A method as recited in claim 17, further comprising redistributing ones of the first set of bond pads and/or second set of bond pads with portions of the second conductive layer.

* * * * *